United States Patent [19]
Yanagisawa

[11] Patent Number: 5,736,844
[45] Date of Patent: Apr. 7, 1998

[54] VOLTAGE CONTROLLED LASER DIODE DRIVE CIRCUIT

[75] Inventor: Hiroki Yanagisawa, Tokyo, Japan

[73] Assignee: NEC Corporation, Tokyo, Japan

[21] Appl. No.: 688,270

[22] Filed: Jul. 29, 1996

[30] Foreign Application Priority Data

Jul. 28, 1995 [JP] Japan .................. 7-193575

[51] Int. Cl.$^6$ .................. G05F 1/40; H01S 3/00
[52] U.S. Cl. .................. 323/282; 372/29; 372/38
[58] Field of Search .................. 323/282; 372/29, 372/38

[56] References Cited

U.S. PATENT DOCUMENTS

| | | | |
|---|---|---|---|
| 5,115,147 | 5/1992 | Kusano et al. | |
| 5,463,648 | 10/1995 | Gibbs | 372/38 |
| 5,477,557 | 12/1995 | Inaba et al. | 372/38 |
| 5,521,933 | 5/1996 | Sosa | 372/38 |
| 5,530,936 | 6/1996 | Harasawa | 372/38 |
| 5,563,898 | 10/1996 | Ikeuchi et al. | 372/29 |

FOREIGN PATENT DOCUMENTS

| | | |
|---|---|---|
| 4-103183 | 4/1992 | Japan . |
| 6-120809 | 4/1994 | Japan . |
| 7-154016 | 6/1995 | Japan . |

*Primary Examiner*—Stuart N. Hecker
*Attorney, Agent, or Firm*—Young & Thompson

[57] ABSTRACT

A voltage controlled oscillator includes transistors Q1, Q2 and Q3 constituting a differential amplifier circuit. The differential amplifier circuit performs switching operations in accordance with input pulse signals. A current amplitude determined by the emitter current of the transistor Q3 drives a laser diode. An operational amplifier 6 has an output connected to the base of the transistor Q3 via an emitter follower Q7. A control terminal 7 is connected to the non-inverting input of the operational amplifier 6. A voltage applied to the control terminal 7 controls the base potential of the transistor Q3, thereby changing the emitter current of the transistor Q3. The current for driving the laser diode is controlled by the voltage signal via the emitter follower. Therefore, the ON/OFF control of the drive current can be executed surely and stably without being influenced by noise, wiring pattern capacity or the like and even from the outside of the laser diode drive circuit.

2 Claims, 5 Drawing Sheets

VOLTAGE CONTROLLED LASER DIODE DRIVE CIRCUIT

BACKGROUND OF THE INVENTION

1. Field of the Invention

The present invention relates to a laser diode drive circuit and, more particularly, to a laser diode drive circuit allowing, e.g., a laser diode drive current source to be ON/OFF controlled from the outside of the drive circuit.

2. Description of the Related Art

A TDMA (Time Division Multiple Access) or a TCM (Time Compression Multiplex) optical subscriber system as well as other systems uses an optical transmission circuit for transmitting burst signals. Because this kind of optical transmission circuit generally involves long no signal periods, i.e., no emission periods, a laser diode drive current is sometimes interrupted during no signal periods. Also, it is necessary to control the drive current in accordance with the ambient temperature so as to prevent optical output power from fluctuating. In this manner, the drive current must be ON/OFF controlled and must have its value controlled in accordance with the conditions of use and surrounding conditions.

On the other hand, it is sometimes desired to apply a conventional optical transmission circuit for continuous signals, as distinguished from burst signals, directly to a laser diode drive circuit. In such a case, an exclusive control circuit is added to the above circuits in order to control the drive current. For example, an optical transmitter designed for miniaturization sometimes has a laser diode drive circuit and a laser diode built in a single package, and has a drive current control circuit implemented as a separate IC (Integrated circuit) together with other digital circuitry. With this configuration, it is necessary to control the drive current from the outside of the laser diode drive circuit.

It is a common practice with a laser diode drive circuit to use an outside drive current control circuit consisting of a transistor and a constant current source. The conventional control circuit uses a current signal to control the value of a drive current for driving a laser diode and to ON/OFF control the oscillation of the laser diode. Specifically, the laser diode or light emitting device is connected between the collector of the transistor and a power source. A differential pair controls the drive current with its emitter current. The amplitude of a pulse current is usually determined by the emitter current of the transistor.

However, the conventional laser diode drive circuit with the above construction causes ringing to occur on the transition of the current waveform from an OFF state to an ON state. The ringing increases the input/output impedance between the laser diode drive circuit and the control circuit. As a result, the drive circuit is susceptible to noise ascribable to, e.g., the turn-round of a clock signal.

Moreover, ringing also occurs in the optical output waveform on the transition of the drive current from the OFF state to the ON state. To solve the above problems, it is necessary that the wiring pattern of the laser diode drive circuit and control circuit be designed with greatest care. This limits the design freedom of the circuitry.

SUMMARY OF THE INVENTION

It is therefore an object of the present invention to provide a voltage controlled laser diode drive circuit capable of driving a laser diode accurately and stably.

A voltage controlled laser diode drive circuit of the present invention is characterized in that it ON/OFF controls a laser diode drive current Iop by using a voltage signal.

In a preferred embodiment, the drive circuit includes a differential amplifier for feeding a pulse signal to a laser diode, a transistor for feeding a drive current to the laser diode, and an operational amplifier. The output of the operational amplifier is connected to the base of the transistor via an emitter follower. The emitter of the transistor is connected to an inverting input of the operational amplifier. A control terminal is provided for controlling a voltage to be applied to a noninverting input of the operational amplifier.

Because the drive circuit controls the drive current Iop via the emitter follower by using a voltage signal, the current Iop can be ON/OFF controlled accurately and stably even from the outside of the drive circuit without being effected by noise or wiring pattern capacity.

BRIEF DESCRIPTION OF THE DRAWINGS

The above and other objects, features and advantages of the present invention will become more apparent from the following detailed description when taken in conjunction with the accompanying drawings wherein.

DESCRIPTION OF THE PREFERRED EMBODIMENTS

Figure 1:
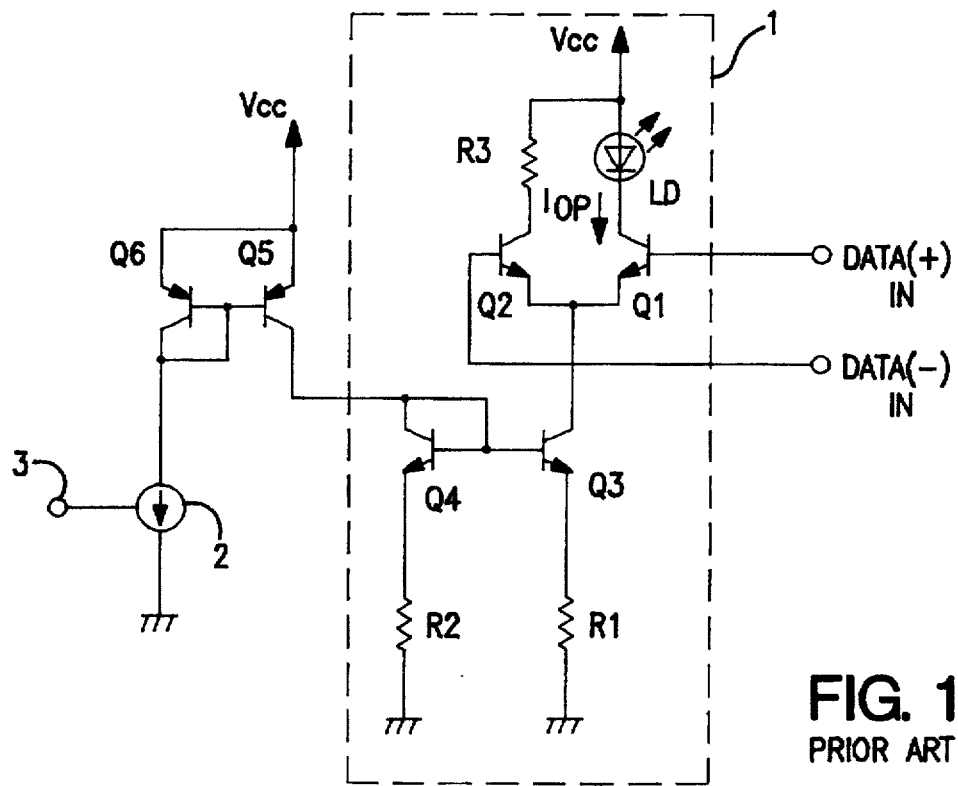
FIG. 1 is a circuit diagram showing a conventional laser diode drive circuit.

To better understand the present invention, a brief reference will be made to a conventional laser diode drive circuit, shown in FIG. 1. First, the operation of the conventional laser diode drive circuit and that of a drive current control circuit will be described. As shown, the laser diode drive circuit, generally 1, has input terminals DATA IN (+) and DATA IN (−) assigned to signal pulses and inverted signal pulses, respectively. Labeled Vcc is a power source. Transistors Q1, Q2 and Q3 constitute a differential amplifier circuit in combination. The transistors Q1 and Q2 each performs the respective switching operation in response to input signal pulses. The transistor Q3 feeds an emitter current to the differential pair.

A laser diode or light emitting device LD is connected between the collector of the transistor Q1 and the power source Vcc. A laser diode drive current (Iop) is controlled by the emitter current fed to the differential pair. The transistors Q3 and Q4 are configured in a current-mirror circuit.

A signal pulse and an inverted signal pulse arrived at the input terminals DATA IN (+) and DATA IN (−), respectively, are applied to the bases of the transistors Q1 and Q2 or differential pair, causing them to perform switching operations. A pulse current corresponding to the input signal is fed to the laser diode laser diode LD and a resistor R3 connected to the collector of the transistor Q2. The pulse current has its amplitude determined by the emitter current of the transistor Q3, i.e., the emitter current of the transistor Q4.

On the other hand, the transistor Q4 has its collector and base connected to the collector of a transistor Q5 situated outside of the laser diode drive circuit 1. The emitter current of the transistor Q4 is controlled by the collector current of the transistor Q5. The transistors Q5 and Q6 are PNP transistors and configured as a current-mirror circuit. A constant current source 2 has its current value determined by a control terminal 3, whereby the current value of the transistors Q5 and Q6 is determined. The transistors Q5 and Q6 and constant current source 2 constitute an Iop control circuit connected to the laser diode drive circuit 1. The Iop control circuit controls the current for driving the laser diode LD with a current signal and selectively turns on or turns off the oscillation of the laser diode LD.

The operation of the circuitry shown in FIG. 1 will be described with reference to FIG. 3. A waveform (a) is representative of the signal appearing on the control terminal 3. As shown, the laser diode drive current Iop is turned on when the signal on the control terminal 3 is in its high level or turned off when the signal is in its low level. A waveform (b) is representative of the signal appearing on the input terminal DATA IN (+), i.e., a sequence of bursts. A waveform (c) is representative of the drive current Iop. As shown, ringing occurs on the transition from the OFF state to the ON state. The ringing results from the fact that because the ON/OFF control relies on the collector current of the transistor Q5, a sharp change in current renders the power source Vcc unstable and thereby renders the waveform of the drive current Iop unstable.

The conventional laser diode drive circuit has its drive current Iop controlled by the current signal generated at the outside of the drive circuit. Therefore, the input/output impedance between the laser diode drive circuit and the control circuit is increased. As a result, the drive circuit is susceptible to noise ascribable to, e.g., the turn-round of a clock signal.

Figures 3A, 3B, 3C, 3D:
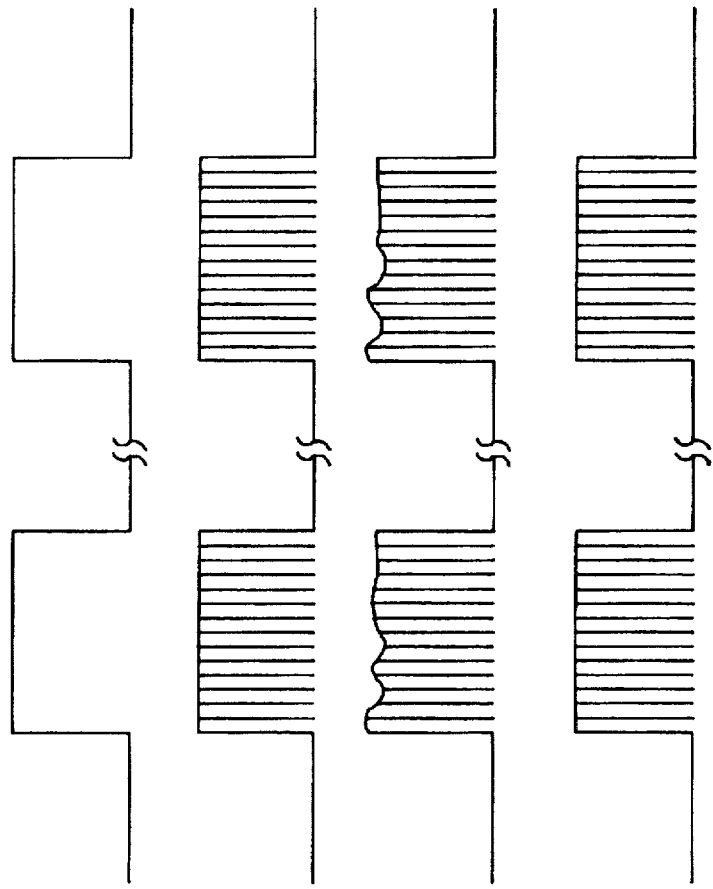
FIG. 3 shows waveforms representative of a laser diode drive signal particular to the conventional drive circuit and a laser diode drive signal available with the illustrative embodiment.

Moreover, ringing also occurs in the light output waveform on the transition of the drive current Iop from the OFF state to the ON state, as stated with reference to the waveform (c) of FIG. 3. To solve the above problems, it is necessary that the wiring pattern of the laser drive circuit and control circuit be designed with greatest care. This limits the design freedom of the circuitry.

Figure 2:
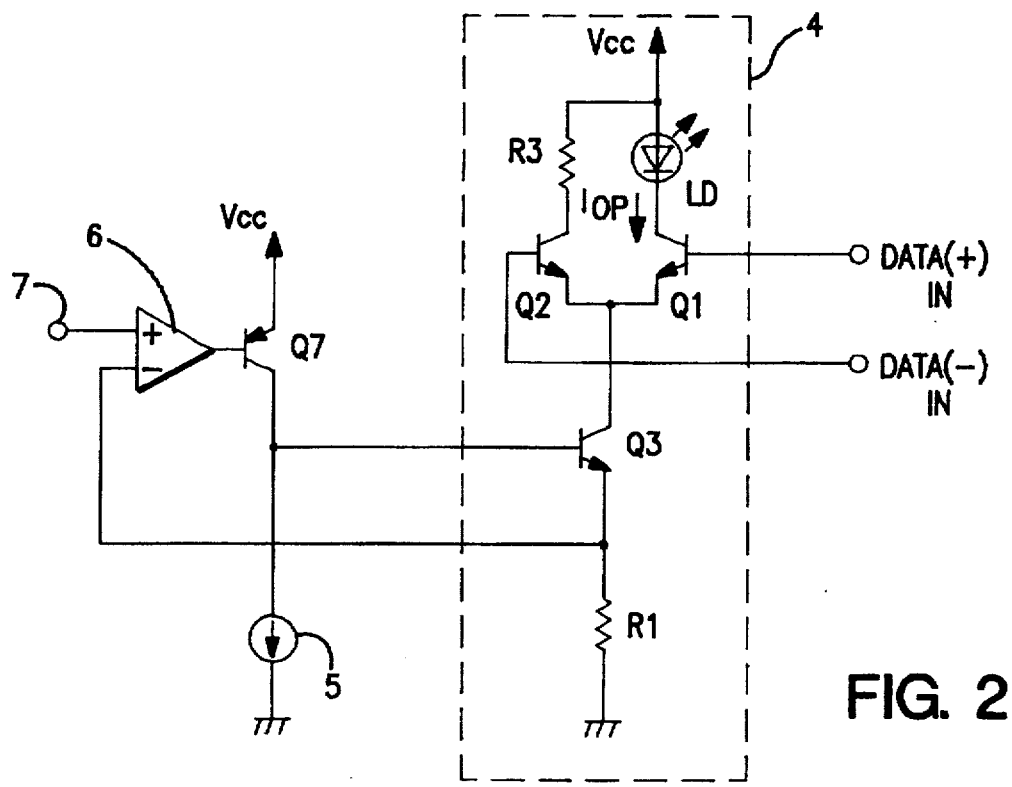
FIG. 2 is a circuit diagram showing a voltage controlled laser diode drive circuit embodying the present invention.

Referring to FIG. 2, a voltage controlled laser diode drive circuit embodying the present invention will be described. As shown, the drive circuit, generally 4, also includes transistors Q1, Q2 and Q3 constituting a differential amplifier circuit, as in the conventional circuitry shown in FIG. 1. The transistors Q1 and Q2 each performs a switching operation in response to the respective input pulse signal. The transistor Q3 feeds an emitter current to the transistors Q1 and Q2. A current (Iop) for driving a laser diode LD is controlled by the transistor Q3.

On the other hand, the base of the transistor Q3 is connected to the emitter of a transistor Q7 situated outside of the drive circuit 4. The transistor Q7 is an emitter follower; the, emitter current is determined by a constant current source 5. An operational amplifier (OP AMP) 6 has its output connected to the base of the transistor Q7. The output of the OP AMP 6 is fed back to the inverting input of the amplifier 6 via the emitter of the transistor Q7 and that of the transistor Q3. With this configuration, the OP AMP 6 plays the role of a voltage follower. A control terminal 7 connected to the non-inverting input of the OP AMP 6. The base of the transistor Q7 controls a voltage signal in accordance with an input signal voltage applied to the control terminal 7.

The operation of the control circuit 4 will be described, again referring to the waveforms (a)-(c) and a waveform (d) shown in FIG. 3. When the signal (a) on the control terminal 7 is in its high level, the emitter voltage of the transistor or emitter follower Q7 rises via the OP AMP or voltage follower 6. As a result, the transistor Q3 is turned on to cause an emitter current to flow therethrough. The emitter current causes the drive current Iop to flow and drive the laser diode LD.

When the signal (a) is in its low level, the emitter voltage of the transistor Q7 falls and turns off the transistor Q3. At this instant, the emitter current is zero and prevents the laser diode LD from emitting light.

The waveform (d) is representative of the drive current Iop achievable with the illustrative embodiment. As shown, ringing does not occur even on the transition from the OFF state to the ON state. This is because the ON/OFF control is based on the output of the transistor or emitter follower Q7. Specifically, because the impedance as seen from the transistor Q3 side is sufficiently low, a change in the control signal pulse does not effect the power source Vet or the drive current Iop. Therefore, the laser diode LD is capable of outputting a stable optical signal.

Even when the signal on the control terminal 7 changes in an analog fashion as during the temperature control of the optical output of a laser diode, the emitter voltage of the transistor Q7 changes in accordance with the change in the above signal. This allows the emitter current of the transistor Q3, i.e., the drive current Iop to be accurately controlled in an analog fashion.

The voltage controlled laser diode drive circuit having the above configuration is particularly feasible for burst transmission in which a period of time available for the modulation of a LD and the transmission of the resulting signal is limited.

Figure 4:
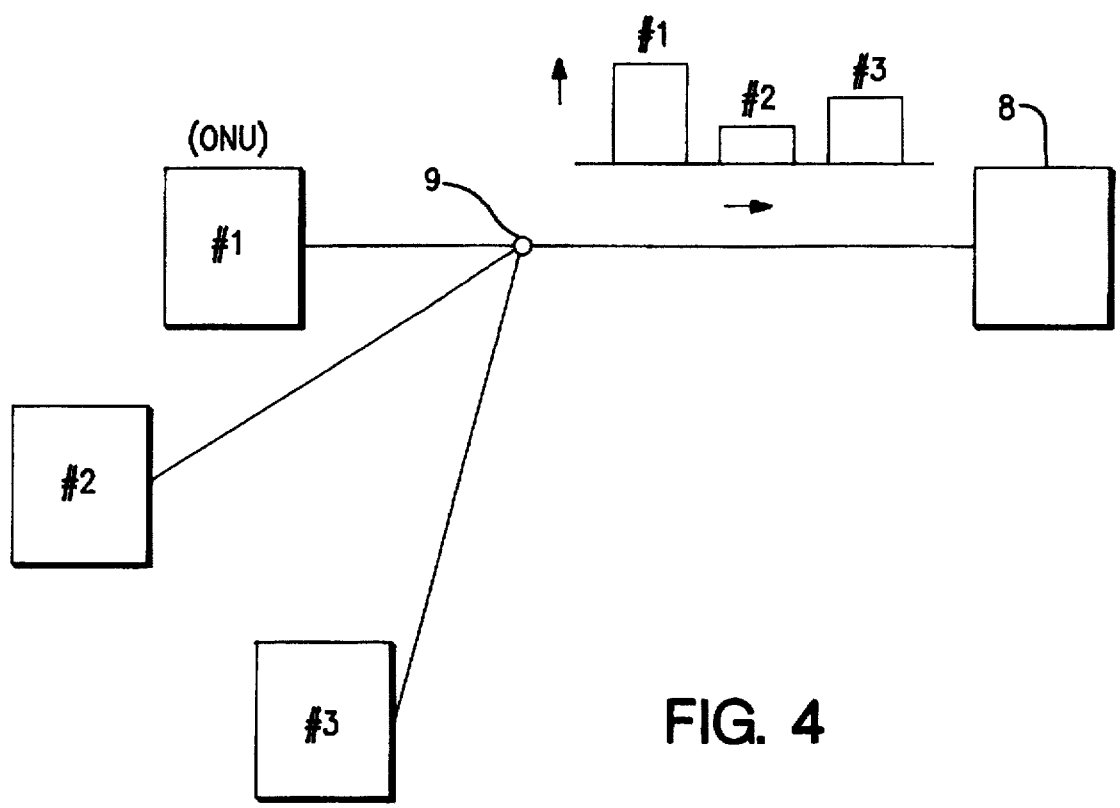
FIG. 4 is a block diagram schematically showing a specific construction of a burst transmission system to which the embodiment of the present invention is applicable.

FIG. 4 shows a specific system construction for burst transmission. As shown, a terminal station 8 and a plurality of subscriber stations (ONU) #1, #2 and #3 are connected together by way of a star coupler 9. While only three subscriber stations are shown in FIG. 4, usually sixteen or more subscribers stations are connected to the terminal station 8. An optical signal sent from the terminal station 8 is distributed to the subscriber stations #1–#3 by the star coupler 9. On the other hand, the subscriber stations #1–#3 each sends necessary data to the terminal station 8 via the star coupler 9.

Figure 5:
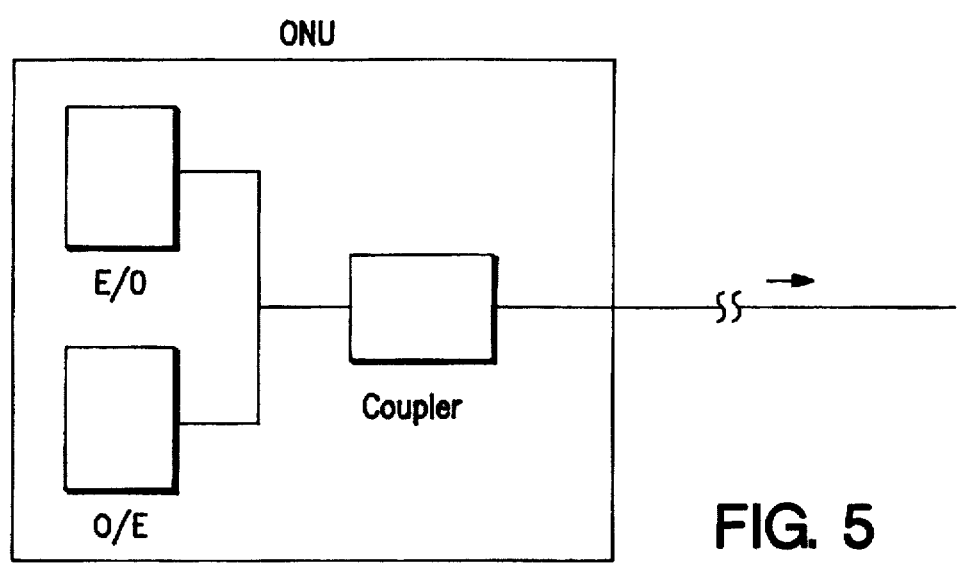
FIG. 5 is a block diagram schematically showing a specific configuration of a subscriber station included in the system of FIG. 4.

FIG. 5 shows a specific construction of each of the subscriber stations #1–#3. As shown, the subscriber station has an O/E converter for converting an input optical signal to a corresponding electric signal, and an E/O converter for converting an electric signal to an optical signal. Usually, the O/E converter and E/O converter are connected together by an optical coupler in order to implement bidirectional transmission using a single optical fiber.

The LD drive circuit 4 is built in the E/O converter of the subscriber station. The optical signals output from the subscriber stations are multiplexed by a time division scheme and then sent to the terminal station 8 because they do not have to be continuously sent. Therefore, each subscriber station should only hold the LD drive circuit 4 in a transmittable state only during the transmission of necessary data. Because the LD drive circuit 4 uses voltage control in setting up and cancelling the transmittable state, ringing does not occur on the transition from the OFF state to the ON stage, as stated with reference to FIG. 3.

Figure 6:
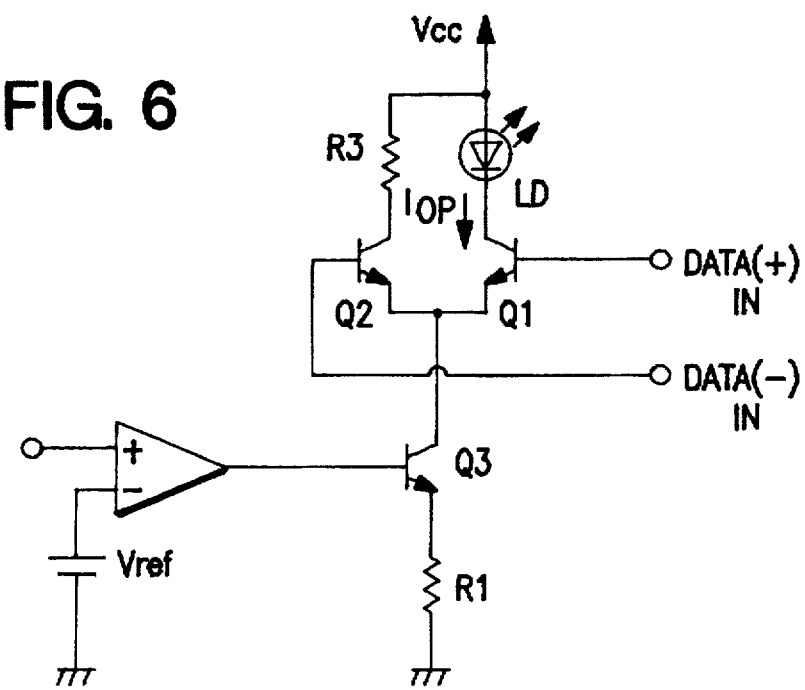
FIGS. 6–9 are circuit diagrams each showing a particular alternative embodiment of the present invention.
Figure 7:
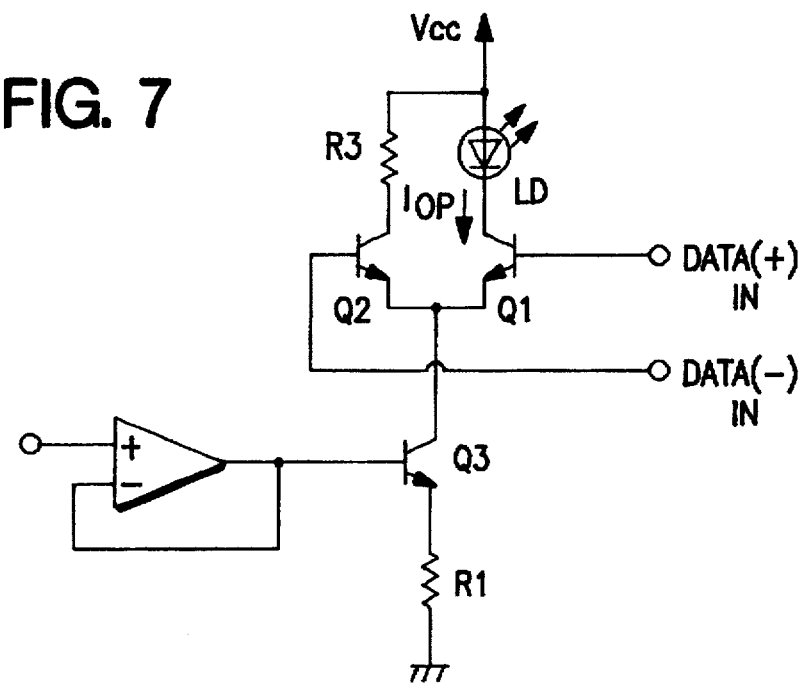
Figure 8:
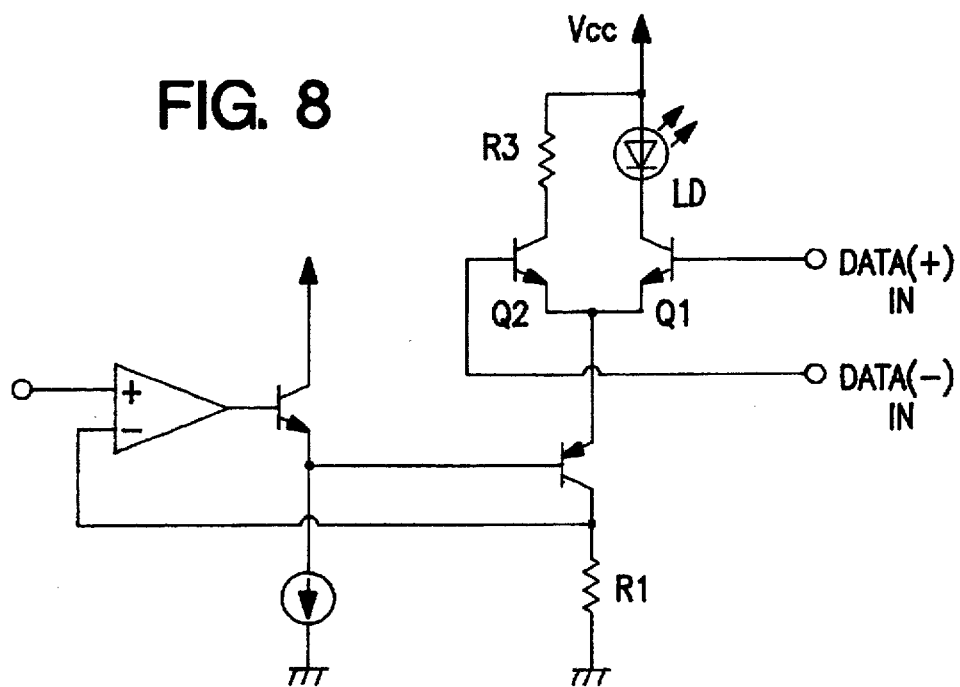
Figure 9:
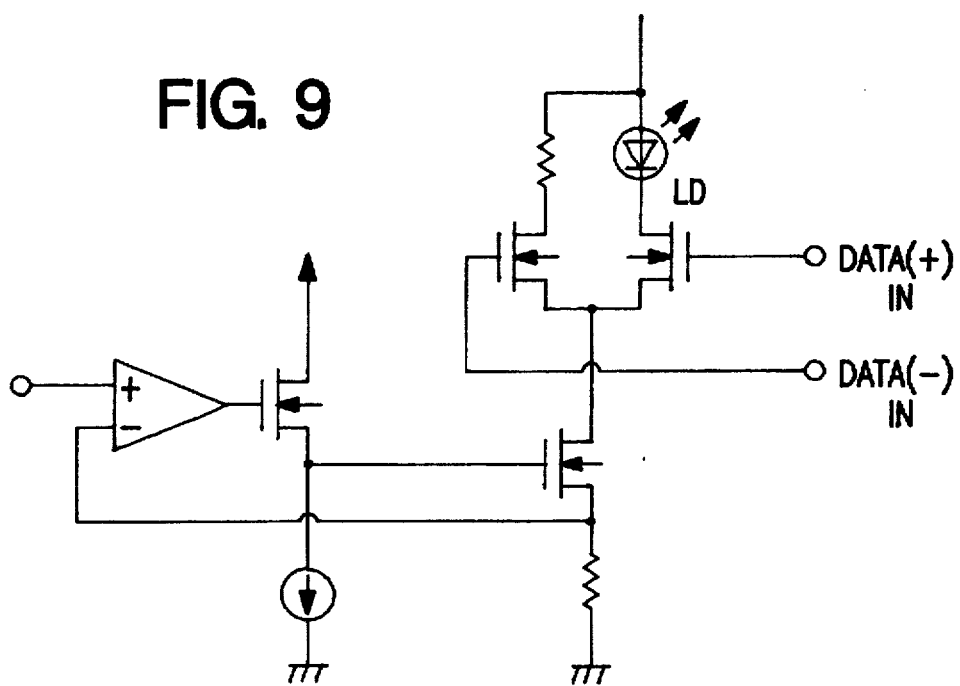

FIG. 6 shows an alternative embodiment of the present invention. As shown, the output of the operational amplifier is directly connected to the transistor Q3. Other alternative embodiments are shown in FIGS. 7-9 and also capable of achieving the advantages stated earlier.

In summary, in accordance with the present invention, a voltage controlled laser diode drive circuit controls a current for driving an laser diode by using a voltage signal. Therefore, even when the drive circuit is controlled by an outside circuit connected thereto, it is free from the influence of noise and wiring pattern capacity. It follows that the ON/OFF control of a laser diode drive current, the temperature compensation control of an laser diode optical output and so forth can be executed surely and stably. In addition, the drive circuit does not need a current-mirror circuit constituting a current source, and therefore saves power, compared to the conventional drive circuit.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A voltage controlled laser diode drive circuit comprising:

a laser diode;

a differential amplifier circuit for driving said laser diode with pulses;

a transistor for feeding a drive current to said laser diode;

an operational amplifier having an inverting input connected to an emitter of said transistor, and an output connected to a base of said transistor via an emitter follower; and control means for controlling a voltage to be applied to a non-inverting input of said operational amplifier.

2. A voltage controlled laser diode drive circuit comprising:

a laser diode;

a differential amplifier circuit for driving said laser diode with pulses;

a transistor for feeding a drive current to said laser diode;

an operational amplifier having an output connected to a base of said transistor, and a non-inverting input to which said output is fed back; and control means for controlling a voltage to be applied to a non-inverting input of said operational amplifier.

* * * * *